United States Patent
Chueh

(10) Patent No.: US 12,108,578 B2
(45) Date of Patent: Oct. 1, 2024

(54) HEAT DISSIPATING ASSEMBLY AND ELECTRONIC ASSEMBLY AND ELECTRONIC DEVICE INCLUDING THE SAME

(71) Applicant: WISTRON CORP., New Taipei (TW)

(72) Inventor: Yi-Hsuan Chueh, New Taipei (TW)

(73) Assignee: WISTRON CORP., New Taipei (TW)

( * ) Notice: Subject to any disclaimer, the term of this patent is extended or adjusted under 35 U.S.C. 154(b) by 254 days.

(21) Appl. No.: 17/938,056

(22) Filed: Oct. 5, 2022

(65) Prior Publication Data

US 2024/0032258 A1    Jan. 25, 2024

(30) Foreign Application Priority Data

Jul. 22, 2022    (TW) .................................. 111127554

(51) Int. Cl.
| | |
|---|---|
| *G06F 1/16* | (2006.01) |
| *H05K 5/00* | (2006.01) |
| *H05K 7/00* | (2006.01) |
| *H05K 7/20* | (2006.01) |

(52) U.S. Cl.
CPC ..... *H05K 7/20736* (2013.01); *H05K 7/20145* (2013.01); *H05K 7/20154* (2013.01)

(58) Field of Classification Search
CPC .......... H05K 7/20736; H05K 7/20145; H05K 7/20154; H05K 7/20163; H05K 7/20172; H05K 7/20136; H05K 7/20409; H05K 7/2039; H05K 7/20418
See application file for complete search history.

(56) References Cited

U.S. PATENT DOCUMENTS

| | | | |
|---|---|---|---|
| 7,342,785 B2 | 3/2008 | Liu | |
| 7,474,526 B2 * | 1/2009 | Fujiwara | G06F 1/203 |
| | | | 165/122 |
| 7,667,961 B2 * | 2/2010 | Fujiwara | H01L 23/427 |
| | | | 361/679.55 |
| 8,120,907 B2 * | 2/2012 | Chen | H01L 23/467 |
| | | | 361/695 |
| 10,492,335 B1 * | 11/2019 | Hung | H01L 23/36 |
| 10,622,279 B1 * | 4/2020 | Minawati | H01L 23/427 |

(Continued)

FOREIGN PATENT DOCUMENTS

| | | |
|---|---|---|
| TW | 200638182 A | 11/2006 |
| TW | M310578 U | 4/2007 |

OTHER PUBLICATIONS

TW Office Action dated May 24, 2023 in Taiwan application No. 111127554.

*Primary Examiner* — Anthony M Haughton
(74) *Attorney, Agent, or Firm* — McClure, Qualey & Rodack, LLP

(57) ABSTRACT

A heat dissipating assembly including a heat sink and an air baffle, the heat sink includes a base portion, a heatsink portion, installation channels, and first installation hole portions, the base portion is stackable on an electronic component, the heatsink portion comprises fins extend outwardly from the base portion, the first installation hole portions are located on the base portion and respectively correspond to the installation channels, the air baffle is disposed on the heatsink portion and includes a second installation hole portion, the second installation hole portion selectively corresponds to one of the installation channels and one of the first installation hole portions.

20 Claims, 7 Drawing Sheets

(56) References Cited

U.S. PATENT DOCUMENTS

| | | | |
|---|---|---|---|
| 2008/0165501 A1* | 7/2008 | Stewart | H01L 23/4006 |
| | | | 361/704 |
| 2008/0185129 A1* | 8/2008 | Joshi | H01L 23/473 |
| | | | 165/182 |
| 2009/0021917 A1* | 1/2009 | Floyd | H01L 23/467 |
| | | | 29/832 |
| 2009/0168349 A1* | 7/2009 | Li | H01L 23/467 |
| | | | 361/697 |
| 2011/0235280 A1* | 9/2011 | Hsieh | H01L 23/4006 |
| | | | 361/720 |
| 2011/0277969 A1* | 11/2011 | Chang | H01L 23/467 |
| | | | 165/121 |
| 2012/0044641 A1* | 2/2012 | Zhu | G06F 1/20 |
| | | | 361/692 |
| 2012/0075804 A1* | 3/2012 | Chen | G06F 1/203 |
| | | | 361/695 |
| 2012/0099278 A1* | 4/2012 | Chen | F28D 15/0233 |
| | | | 165/104.26 |
| 2021/0389112 A1* | 12/2021 | Hung | G01B 5/25 |
| 2022/0015268 A1* | 1/2022 | Jian | H05K 7/20418 |
| 2022/0225533 A1* | 7/2022 | Ritter | H05K 7/20145 |
| 2022/0230936 A1* | 7/2022 | Zhong | H01L 25/0652 |
| 2023/0129211 A1* | 4/2023 | Twiss | H05K 13/0882 |
| | | | 361/709 |
| 2023/0301029 A1* | 9/2023 | Tong | H05K 7/2049 |
| | | | 361/688 |

* cited by examiner

HEAT DISSIPATING ASSEMBLY AND ELECTRONIC ASSEMBLY AND ELECTRONIC DEVICE INCLUDING THE SAME

CROSS-REFERENCE TO RELATED APPLICATIONS

This non-provisional application claims priority under 35 U.S.C. § 119(a) on patent application Ser. No(s). 111127554 filed in Taiwan (R.O.C.) on Jul. 22, 2022, the entire contents of which are hereby incorporated by reference.

Technical Field

The disclosure relates to a heat dissipating assembly, more particularly relates to a heat dissipating assembly including air baffle and an electronic assembly and an electronic device including the same.

Background

Generally, there is an air cooling system built in electronic devices, the electronic devices may be servers or computers, and the air cooling system uses air as a medium to take away heat from electronic elements (i.e., heat sources) that are needed to be cooled. A heat sink is installed on the heat source in order to enhance the heat dissipation efficiency. A typical heat sink has a base plate and fins protruding from the base plate, the base plate can be in direct thermal contact with the heat source and transfer heat absorbed from the heat sources to the fins, and the fins increase the surface area of the heat sink for dissipating heat.

In some cases, the heat sink relies on air baffle to keep it functionable. The air baffle is disposed on the heat sink to help guiding airflow more directly to flow through the heat sink. Conventionally, the air baffle is installed on the heat sink using additional metal hooking structures, but to assemble the metal hooking structures is time-consuming and costly. Some air baffles are disposed on the heat sink with structure configuration, but it is unable to be produced as precise size and therefore easily creates large gaps to the heat sink result in leakage of cooling air.

SUMMARY

Accordingly, one aspect of the disclosure is to provide a heat dissipating assembly and an electronic assembly and an electronic device including the same which are capable of solving the problems due to the conventional air baffle.

One embodiment of the disclosure provides an electronic assembly including a circuit board, an electronic component, and a heat dissipating assembly, the circuit board includes a plurality of mount holes, the electronic component is disposed on the circuit board, the heat dissipating assembly includes a heat sink stacked on the electronic component and comprising a plurality of first installation hole portions respectively corresponding to the plurality of mount holes of the circuit board and an air baffle disposed on the heat sink and comprising a second installation hole portion, the second installation hole portion selectively corresponds to one of the plurality of first installation hole portions and one of the plurality of mount holes.

Another embodiment of the disclosure provides an electronic device including a device casing and an electronic assembly, the electronic assembly includes a circuit board, an electronic component, and a heat dissipating assembly, the circuit board is disposed on the device casing and includes a plurality of mount holes, the electronic component is disposed on the circuit board, the heat dissipating assembly includes a heat sink and an air baffle, the heat sink is stacked on the electronic component and includes a plurality of first installation hole portions respectively corresponding to the plurality of mount holes of the circuit board, the air baffle is disposed on the heat sink and includes a second installation hole portion, and the second installation hole portion selectively corresponds to one of the plurality of first installation hole portions and one of the plurality of mount holes.

Another embodiment of the disclosure provides a heat dissipating assembly, adapted for an electronic component, including a heat sink and an air baffle, the heat sink includes a base portion, a heatsink portion, installation channels, and first installation hole portions, the base portion is stackable on the electronic component, the heatsink portion comprises fins extending outwardly from the base portion, the first installation hole portions are located on the base portion and respectively correspond to the installation channels, the air baffle is disposed on the heatsink portion and includes a second installation hole portion, the second installation hole portion selectively corresponds to one of the installation channels and one of the first installation hole portions.

According to the heat dissipating assembly, the electronic assembly, and the electronic device as discussed in the above embodiments of the disclosure, one of the mount holes of the circuit board is exposed to the second installation hole portion of the air baffle via the first installation hole portion of the heat sink, thus the fastener used to install the heat sink to the circuit board can be adopted to install the air baffle; that is, the air baffle and the heat sink can share at least fastener for fixation. As such, the installation of the air baffle does not need additional screws, bolts, or any conventional metal hooking structures, and thereby significantly simplifying the assembly process and reducing the time and cost on installation works.

Also, since the air baffle and the heat sink are installed using the same fasteners, the position of the air baffle on the heat sink is precisely secured and therefore is beneficial for preventing gap that causes airflow leakage from occurring between the air baffle and the heat sink.

In such an arrangement, the installation of the air baffle can be combined into the installation process of the heat sink. This not only can simplify the assembly line but also can prevent assembly failure due to additional assembly line for installing air baffle. And the air baffle may be pre-installed on the heat sink, such that there is no need to additionally remove or install the air baffle during the removal or installation of the heat sink, thus simplifying the maintenance works of the electronic component and preventing forgetting the installation of the air baffle.

BRIEF DESCRIPTION OF THE DRAWINGS

The present disclosure will become better understood from the detailed description given hereinbelow and the accompanying drawings which are given by way of illustration only and thus are not intending to limit the present disclosure and wherein.

DETAILED DESCRIPTION

Aspects and advantages of the disclosure will become apparent from the following detailed descriptions with the accompanying drawings. The inclusion of such details provides a thorough understanding of the disclosure sufficient to enable one skilled in the art to practice the described embodiments but it is for the purpose of illustration only and should not be understood to limit the disclosure. On the contrary, it is intended to cover alternatives, modifications, and equivalents as can be included within the spirit and scope of the described embodiments as defined by the appended claims. To this end, those skilled in the relevant art will recognize and appreciate that many changes can be made to the various aspects of the disclosure described herein, while still obtaining the beneficial results of the present disclosure. It will also be apparent that some of the desired benefits of the present disclosure can be obtained by selecting some of the features of the present disclosure without utilizing other features.

It is to be understood that the phraseology and terminology used herein are for the purpose of better understanding the descriptions and should not be regarded as limiting. As used herein, the terms "substantially" or "approximately" may describe a slight deviation from a target value, in particular a deviation within the production accuracy and/or within the necessary accuracy, so that an effect as present with the target value is maintained. Unless specified or limited otherwise, the phrase "at least one" as used herein may mean that the quantity of the described element or component is one or more than one but does not necessarily mean that the quantity is only one. The term "and/or" may be used herein to indicate that either or both of two stated possibilities. Unless specified or limited otherwise, the terms "mounted", "connected", "disposed", "fixed", and variations thereof are used broadly and encompass both direct and indirect mounting, connection, disposing, and fixing.

Figure 1:
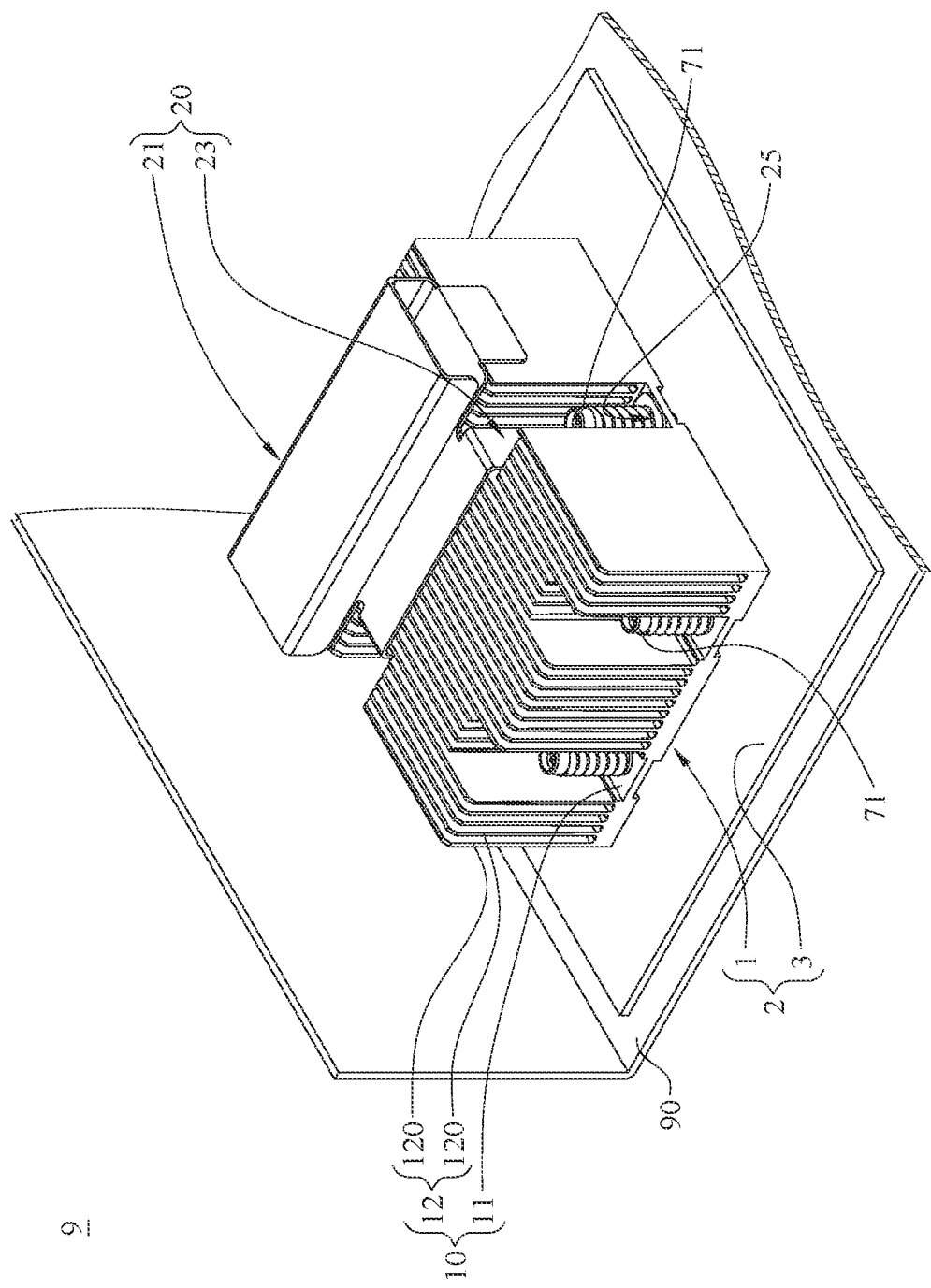
FIG. 1 is a partially enlarged perspective view of an electronic device according to one embodiment of the disclosure.
Figure 2:
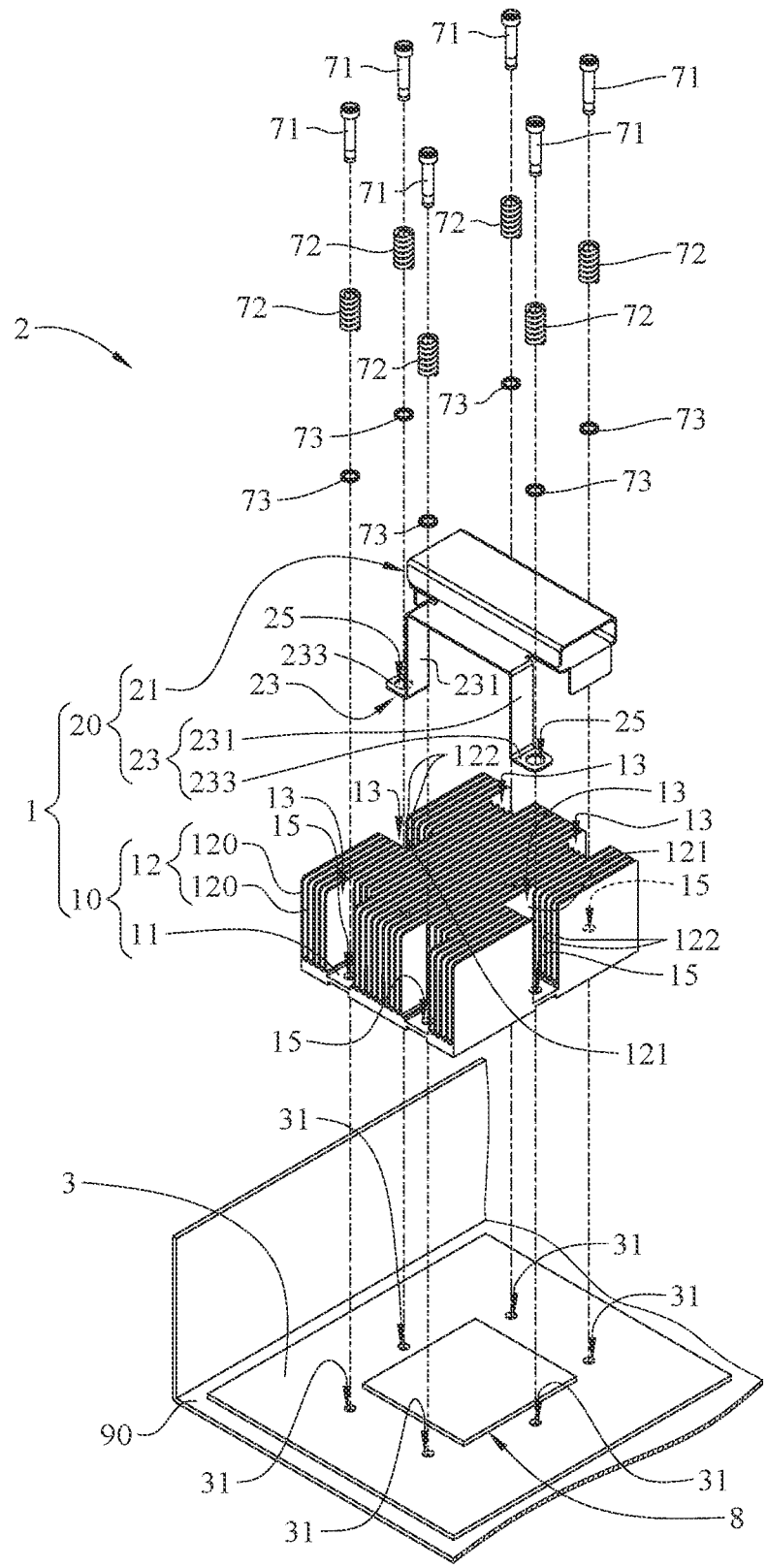
FIG. 2 is an exploded view of an electronic assembly in FIG. 1.

Referring to FIGS. 1-2, one embodiment of the disclosure provides an electronic device 9, the electronic device 9 may be, but is not limited to, a server, desktop computer, or part thereof. The electronic device 9 may include a device casing 90 used to accommodate or support electrical/non-electrical component or module as required. For example, the device casing 90 may support an electronic assembly 2 thereon. The electronic assembly 2 may include a heat dissipating assembly 1 and a circuit board 3. The circuit board 3 may be any suitable circuit board. There may be one or more electronic components 8 arranged on the circuit board 3. The electronic component 8 may produce heat during operation and therefore is needed to be cooled. The electronic component 8 is, but not limited to, any suitable central processing unit. Note that the disclosure is not limited by the electronic component 8 of its type and configuration thereof. The heat dissipating assembly 1 may include a heat sink 10 and an air baffle 20, the heat sink 10 may be stacked on the electronic component 8 being disposed on the circuit board 3 and is able to thermally contact the electronic component 8 and absorb the heat generated by the electronic component 8. The air baffle 20 may be removably installed on the heat sink 10 and is beneficial to guide ambient air to flow through the heat sink 10 and thereby further improving the heat dissipation of the heat sink 10.

In some applications, there may be a gap existing between the heat sink 10 and peripheral components, modules or structures (not shown) above the heat sink 10, the larger the gap, the easier the airflow for cooling the heat sink 10 is dispersed, and thereby affecting the heat dissipation. To prevent such a problem, the air baffle 20 is installed on the heat sink 10 to block ambient airflow to pass through the gap; in other words, the air baffle 20 is able to guide the cooling air to flow into the heat sink 10 and therefore ensures a sufficient amount of cooling air passing through the heat sink 10. Note that the shape and size of the air baffle 20 are not limiting and may be modified to fit the gap and to prevent having interference with components, modules, and structures nearby.

Figure 3:
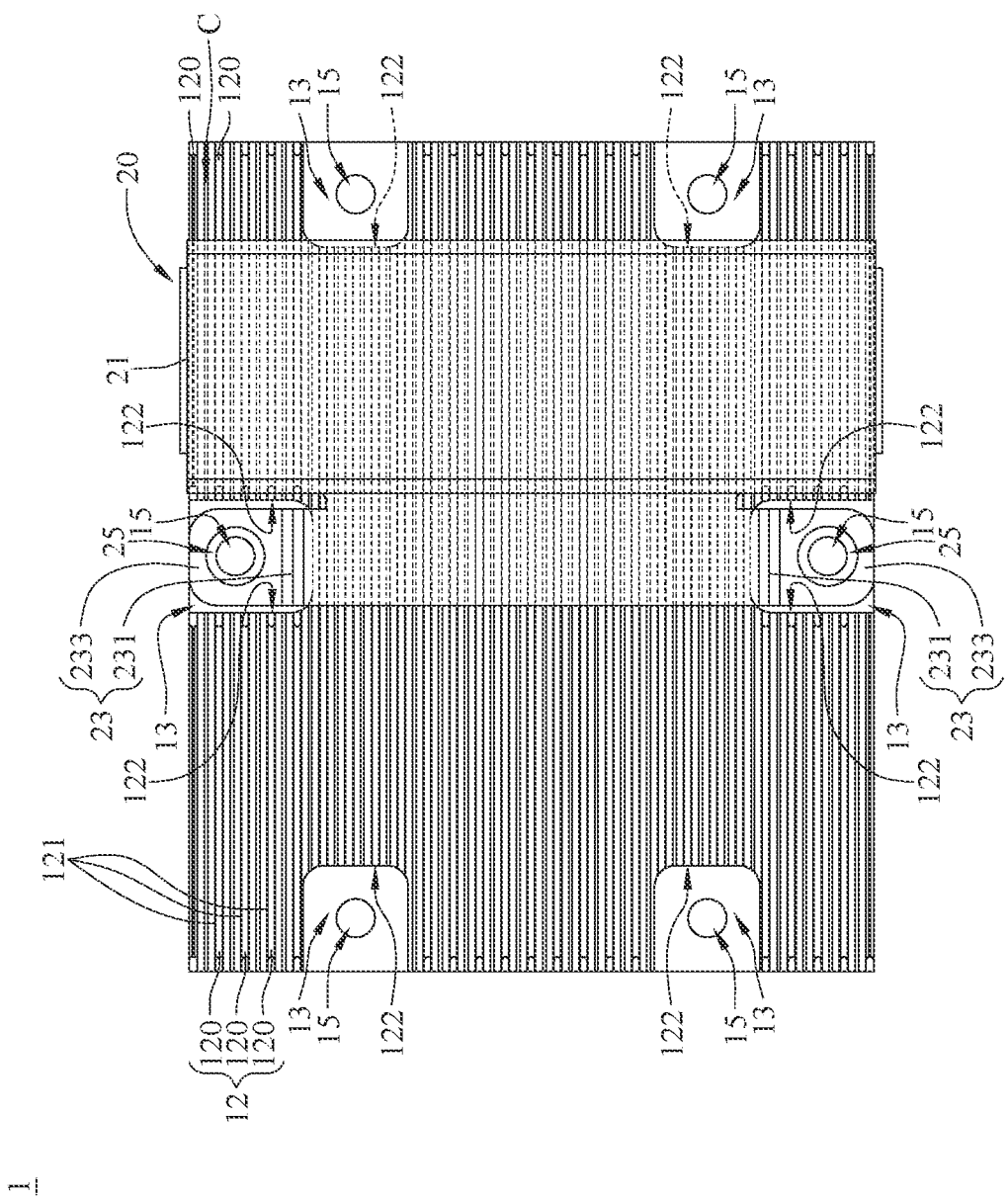
FIG. 3 is a top view of a heat dissipating assembly in FIG. 1.

The air baffle 20 may be firmly and precisely installed on a specific area of the heat sink 10 to prevent leakage of air for cooling the heat sink 10. Please see FIGS. 1-2 and further refer to FIGS. 3-4, the details of the heat sink 10 and the air baffle 20 are given hereinafter.

In this embodiment, the heat sink 10 may be integrally formed of any suitable material, the heat sink 10 may include a base portion 11 and a heatsink portion 12. The base portion 11 means the part of the heat sink 10 served to be stacked on the electronic component 8. The base portion 11 may have a surface used to thermally contact the electronic component 8 to absorb the heat generated by the electronic component 8. The heatsink portion 12 may include one or more fins 120. The fins 120 extend outwardly from a surface of the base portion 11. For example, the fins 120 may extend outwardly from a surface of the base portion 11 located opposite to the circuit board 3. The fins 120 may be spaced apart from one another by suitable distance, thus any two of the fins 20 located adjacent to each other may define a fin gap C therebetwen for airflow. As such, heat absorbed by the base portion 11 may be transferred to the fins 120, and the fins 120 increase the surface area of the heat sink 10 for dissipating heat so that the heat taken away by the airflow passing through the fin gaps C is increased.

In the electronic assembly 2, a plurality of fasteners 71 may be employed to fix the heat sink 10 to the area of the circuit board 3 used for the placement of the electronic component 8. In specific, the fasteners 71 may penetrate through the heat sink 10 and screwed into the mount holes 31 of the circuit board 3 so that the heat sink 10 is firmly stacked on the circuit board 3 and in thermal contact with the electronic component 8. More specifically, the heat sink 10 may include a plurality of first installation hole portions 15 on the base portion 11, each of the first installation hole portions 15 is, for example, a through hole, the first installation hole portions 15 respectively correspond to the mount holes 31 of the circuit board 3 so that the fasteners 71 may penetrate through the first installation hole portions 15 and then inserted into the mount holes 31 of the circuit board 3. It is noted that the quantity of the mount holes 31 and the distances between the mount holes 31 and the electronic component 8 are designed by following the industry standards; thus, the quantity and location of the mount holes 31 and the first installation hole portions 15 of the heat sink 10 are designed by following the same industry standard so as to make the first installation hole portions 15 respectively correspond to the mount holes 31 on the circuit board 3.

In this embodiment, the heat sink 10 may further include a plurality of installation channels 13. The installation channels 13 extend from a side of the heatsink portion 12 located away from the base portion 11 toward the base portion 11 and are able to respectively expose the first installation hole portions 15; that is, the installation channels 13 are in direct fluid communication with the first installation hole portions 15. In other words, the installation channels 13 penetrate through the heatsink portions 12 to respectively expose the first installation hole portions 15 on the base portion 11. Thus, the quantity and location of the installation channels 13 correspond to those of the mount holes 31 on the circuit board 3. The phrase "in fluid communication with" may be used herein to mean that fluid (liquid and/or gas) is allowed to flow between two spaces, areas, slots, holes, channels and/or openings. As such, the fasteners 71 may be respectively inserted into the first installation hole portions 15 through the installation channels 13.

More specifically, at least one of the installation channels 13 may be defined by the base portion 11, a sidewall 121 of one of the fins 120, and one or more side edges 122 of the adjacent fins 120, while at least one of other installation channels 13 may be defined by the base portion 11, sidewalls 121 of two of fins 120, and one or more side edges 122 of the adjacent fins 120. Thus, the installation channels 13 may in fluid communication with the fin gap C.

In this embodiment, the air baffle 20 may be integrally formed of any suitable material, the air baffle 20 may include a main portion 21 and at least one supporting portion 23. The main portion 21 means the part of the air baffle 20 served to be stacked on the heatsink portion 12 of the heat sink 10. Note that the shape and size of the main portion 21 are not limiting and may be modified to fit the gap between the heat sink 10 and peripheral components, modules, and structures adjacent to the heat sink 10.

The supporting portion 23 extends toward the circuit board 3 from the main portion 21. In this embodiment, at least part of the supporting portion 23 is configured to be placed within the installation channel 13 and may be shaped to fit a part of the contour of the installation channel 13. Specifically, the supporting portion 23 may include a first extension portion 231 and a second extension portion 233. The first extension portion 231 is connected between the main portion 21 and the second extension portion 233 and extends toward the circuit board 3 from the main portion 21 along a direction substantially parallel to the fins 120 of the heatsink portion 12. The second extension portion 233 extends from an end of the first extension portion 231 located opposite to the main portion 21 along a direction at an angle to the first extension portion 231. For example, the second extension portion 233 may extend in a direction substantially parallel the base portion 11 from the first extension portion 231.

As such, the first extension portion 231 and the second extension portion 233 may make the supporting portion 23 have an L-like shape. As shown, the first extension portion 231 and the second extension portion 233 may be respectively located at two adjacent sides of the installation channel 13. In specific, the first extension portion 231 may be located at a side of the installation channel 13, and the second extension portion 233 may be located at the bottom of the installation channel 13 and therefore is stacked on the base portion 11. The second extension portion 233 may have a second installation hole portion 25. The second installation hole portion 25 may be a through hole for the fastener 71 to penetrate therethrough. The second installation hole portion 25 selectively corresponds to one of the first installation hole portions 15 of the base portion 11; in other words, the second installation hole portion 25 may be selectively aligned with one of the first installation hole portions 15 of the base portion 11. Thus, at least one of the first installation hole portions 15 may be located between the second installation hole portion 25 and the mount hole 31 of the circuit board 3 to make the mount hole 31 on the circuit board 3 exposed by the first installation hole portions 15 and the second installation hole portion 25.

Thus, when the supporting portion 23 of the air baffle 20 is arranged in the installation channel 13, the fastener 71 is allowed to penetrate through the second installation hole portion 25 and the first installation hole portion 15 and then is inserted into and engaged with the mount hole 31 of the circuit board 3. As such, the baffle 20 and the heat sink 10 may share the fasteners 71 for fixation. In such an arrangement, the installation of the air baffle 20 does not need additional screws, bolts, or metal hooking structures and thereby significantly simplifying the assembly process and reducing the time and cost on installation works.

Since the air baffle 20 and the heat sink 10 are installed using the same fasteners 71, the position of the air baffle 20 on the heat sink 10 is precisely secured and therefore is beneficial for preventing gap that causes airflow leakage from occurring between the air baffle 20 and the heat sink 10.

Also, the installation of the air baffle 20 can be combined into the installation process of the heat sink 10. This not only can simplify the assembly line but also can prevent assembly failure due to additional assembly line for installing air baffle. And the air baffle 20 may be pre-installed on the heat sink 10 using the fasteners 71 penetrating through the second installation hole portions 25 and the first installation hole portions 15, such that there is no need to additionally remove or install the air baffle 20 during the removal or installation of the heat sink 10, thus simplifying the maintenance works of the electronic component 8 and preventing forgetting the installation of the air baffle 20.

Figure 4:
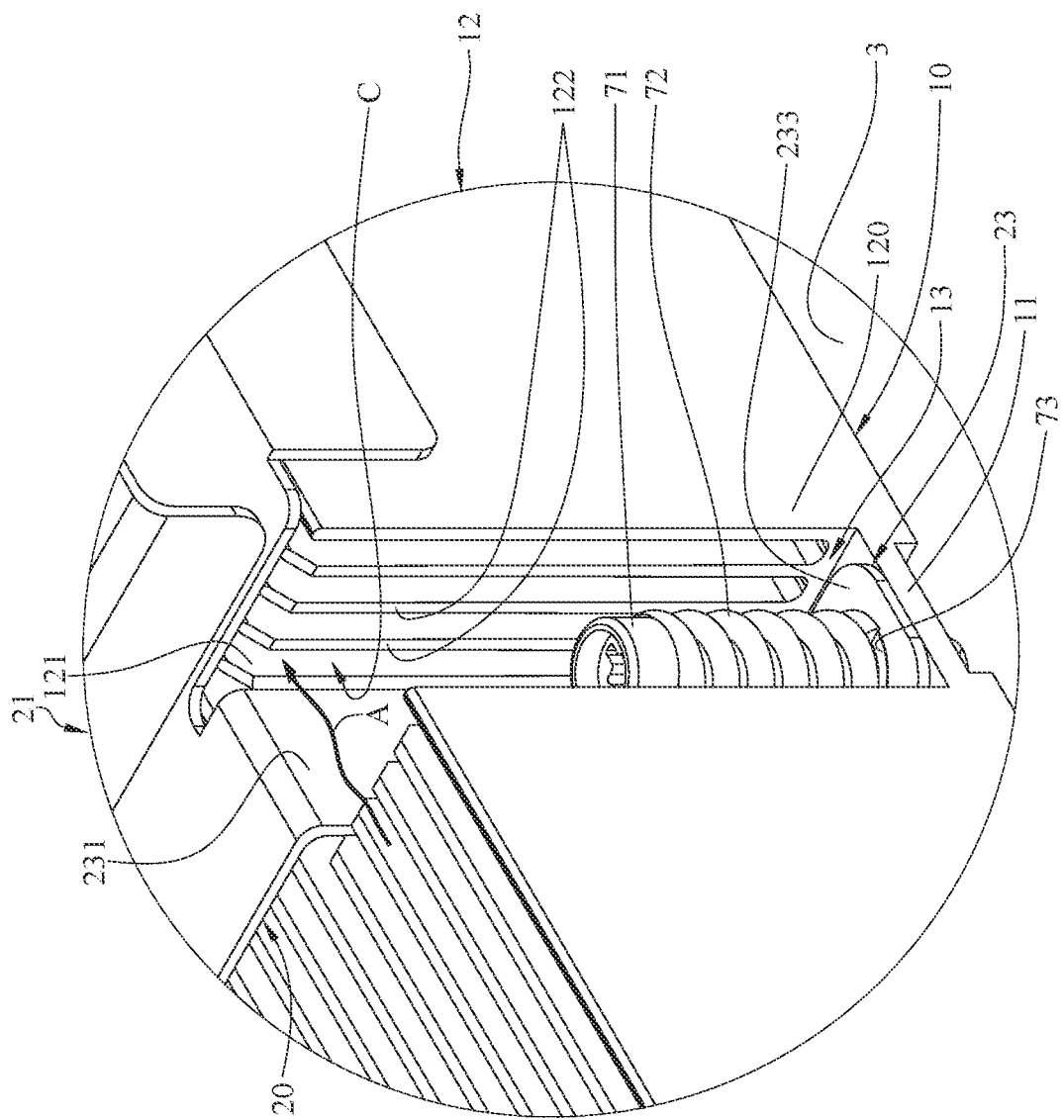
FIG. 4 is a partially enlarged view of the electronic device in FIG. 1.

In addition, the air baffle 20 does not affect the airflow from flowing through the heat sink 10 while the supporting portions 23 are installed in the installation channels 13. Specifically, the first extension portion 231 of the supporting portion 23 may be aligned with side edges 122 of two of the fins 120 located adjacent thereto, that is, the first extension portion 231 is located between the side edges 122 of the adjacent fins 120 and therefore does not block the fin gaps C. As shown in FIG. 4, the airflow A flowing through fin gaps C is not blocked by the first extension portion 231 but the first extension portion 231 is able to guide the airflow A to flow into next fin gap C, thereby ensuring or improving the flowrate of cooling air passing through the heat sink 10.

Optionally, there may be an elastic component 72 sleeved on the fastener 71. The elastic component 72 may be, but is not limited to be, any suitable compression spring. The elastic component 72 may be clamped by the head of the fastener 71 and the second extension portion 233 of the air baffle 20, thus the elastic component 72 is able to create a load or force to tighten the fastener 71.

Optionally, there may be a cushioning structure 73 arranged within the second installation hole portion 25 of the air baffle 20, the cushioning structure 73 may be made of rubber or other suitable material, the fastener 71 is disposed through the cushioning structure 73, thus the cushioning structure 73 is able to reduce or absorb the impact due to the force existing between the air baffle 20 and the fastener 71.

It is noted that the aforementioned electronic assembly is one of exemplary embodiments of the disclosure, the electronic assembly may be further modified as required. For example, in a heat dissipating assembly of another embodiment, the air baffle may have a single supporting portion located in one of the installation channels of the heat sink; that is, the air baffle and the heat sink may share only one fastener for fixation.

Alternatively, please refer to FIGS. 5-6, another embodiment of the disclosure provides an electronic assembly 2', but for the purpose of simplicity, only the main differences between the introduced embodiment and the previous embodiments will be described in detail, and the same or similar parts can be comprehended with reference to the corresponding paragraphs and thus will not be repeatedly described hereinafter. It is also noted that the same reference number denote the same component or element.

Figure 5:
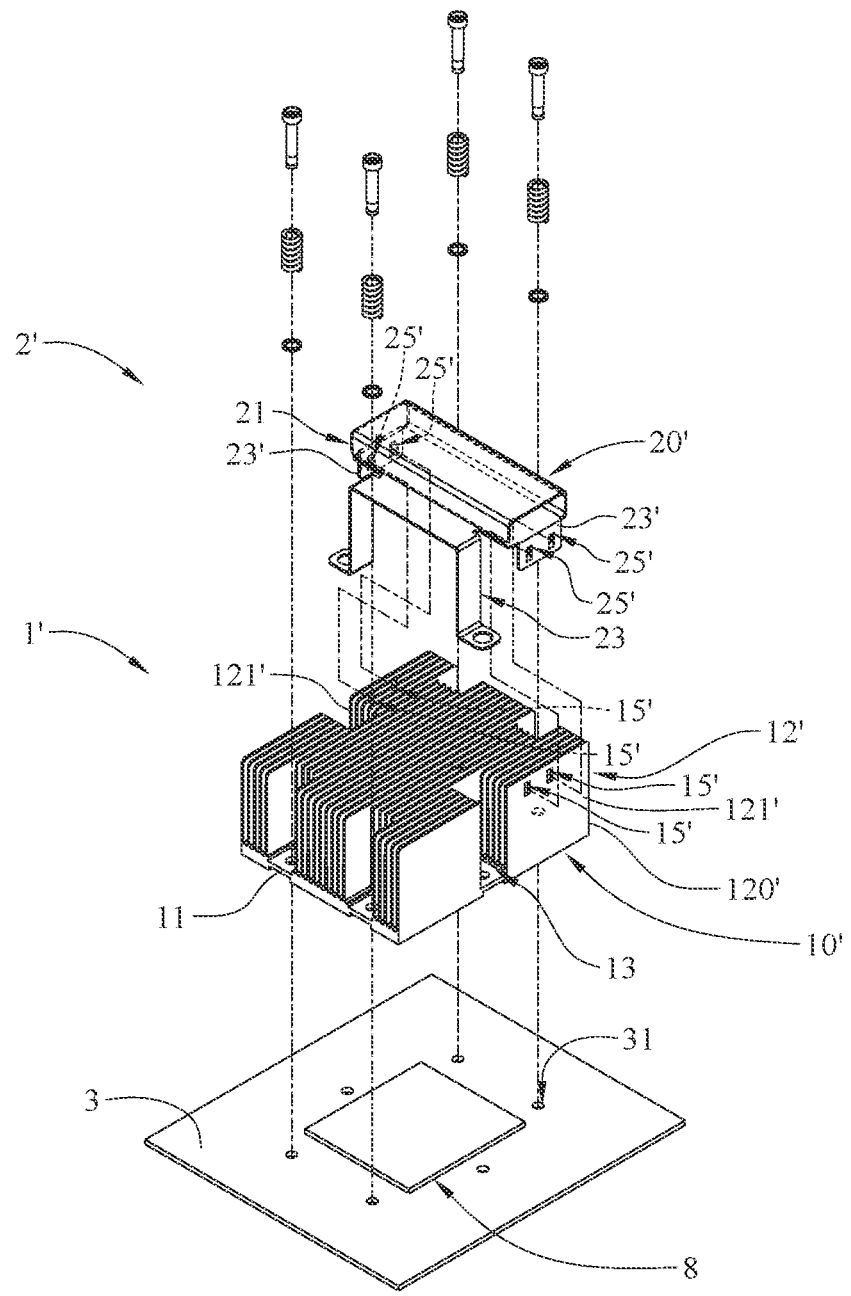
FIG. 5 is an exploded view of an electronic assembly according to another embodiment of the disclosure.

In FIG. 5, in a heatsink portion 12' of a heat sink 10' of a heat dissipating assembly 1', a sidewall 121' of one of fins 120' may have one or more first engagement portions 15' thereon, the first engagement portion 15' is, for example, a through hole or a blind hole formed or recessed on the sidewall 121'. Correspondingly, an air baffle 20' of the heat dissipating assembly 1' includes a supporting portion 23' which extends outwardly from the main portion 21, the supporting portion 23' may have one or more second engagement portions 25' thereon, the second engagement portion 25' is, for example, an elastic structure which protrudes outwardly from a surface of the supporting portion 23' facing toward the heatsink portion 12' of the heat sink 10'.

Figure 6:
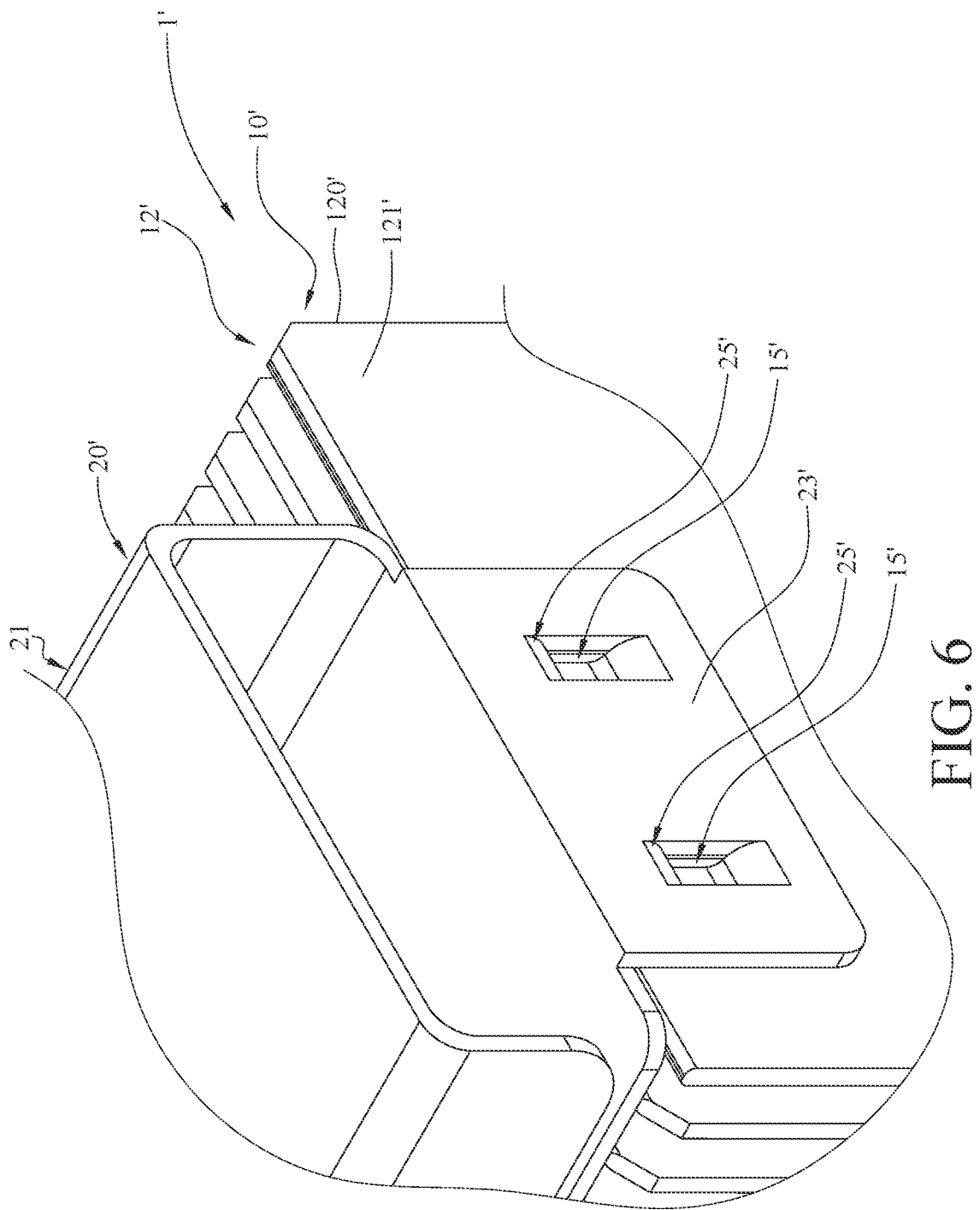
FIG. 6 is a partially enlarged view showing that an air baffle in FIG. 5 is assembled on a heat sink.

In such an arrangement, as shown in FIG. 6, before the fasteners 71 fix the air baffle 20' and the heat sink 10' to the circuit board 3, the air baffle 20' can be temporarily held on the heat sink 10' by engaging the second engagement portions 25' with the first engagement portions 15'. And the engagement between the second engagement portions 25' and the first engagement portions 15' is beneficial for strengthening and stabilizing the installation of the air baffle 20' and the heat sink 10'.

Figure 7:
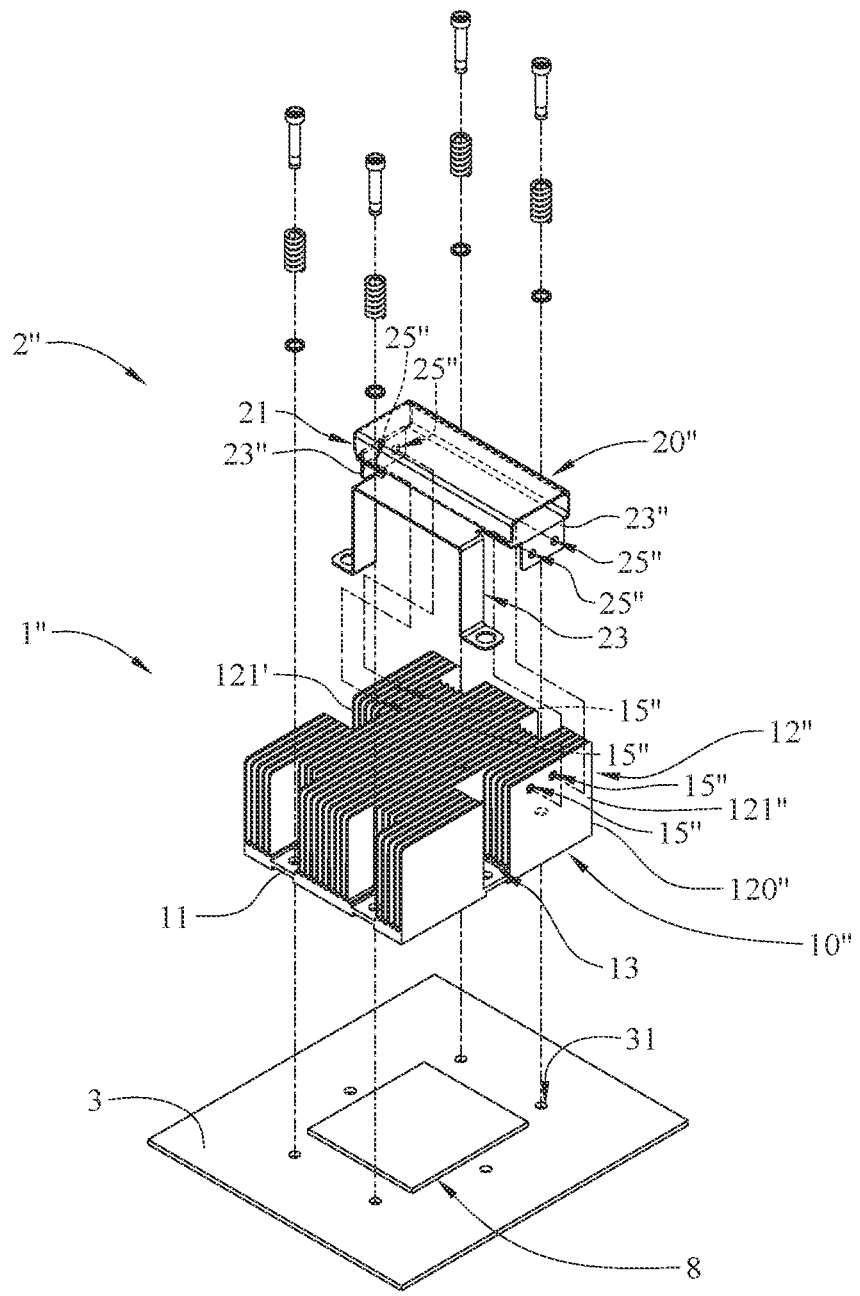
FIG. 7 is an exploded view of an electronic assembly according to another embodiment of the disclosure.

Alternatively, please refer to FIG. 7, another embodiment of the disclosure provides an electronic assembly 2", but for the purpose of simplicity, only the main differences between the introduced embodiment and the previous embodiments will be described in detail, and the same or similar parts can be comprehended with reference to the corresponding paragraphs and thus will not be repeatedly described hereinafter. It is also noted that the same reference number denote the same component or element.

As shown, in a heatsink portion 12" of a heat sink 10" of a heat dissipating assembly 1", a sidewall 121" of one of fins 120" may have one or more first engagement portions 15" thereon, the first engagement portion 15" is, for example, a round recess formed on the sidewall 121". Correspondingly, an air baffle 20" of the heat dissipating assembly 1" includes a supporting portion 23" which extends outwardly from the main portion 21, the supporting portion 23" may have one or more second engagement portions 25" thereon, the second engagement portion 25" is, for example, a bump formed on a surface of the supporting portion 23" facing toward the heatsink portion 12" of the heat sink 10" and fitting the first engagement portion 15" on the fins 120".

In such an arrangement, before the fasteners 71 fix the air baffle 20" and the heat sink 10" to the circuit board 3, the air baffle 20" can be temporarily held on the heat sink 10" by engaging the second engagement portions 25" with the first engagement portions 15". And the engagement between the second engagement portions 25" and the first engagement portions 15" is beneficial for strengthening and stabilizing the installation of the air baffle 20" and the heat sink 10".

According to the heat dissipating assembly, the electronic assembly, and the electronic device as discussed in the above embodiments of the disclosure, one of the mount holes of the circuit board is exposed to the second installation hole portion of the air baffle via the first installation hole portion of the heat sink, thus the fastener used to install the heat sink to the circuit board can be adopted to install the air baffle; that is, the air baffle and the heat sink can share at least fastener for fixation. As such, the installation of the air baffle does not need additional screws, bolts, or any conventional metal hooking structures, and thereby significantly simplifying the assembly process and reducing the time and cost on installation works.

Since the air baffle and the heat sink are installed using the same fasteners, the position of the air baffle on the heat sink is precisely secured and therefore is beneficial for preventing gap that causes airflow leakage from occurring between the air baffle and the heat sink.

In such an arrangement, the installation of the air baffle can be combined into the installation process of the heat sink. This not only can simplify the assembly line but also can prevent assembly failure due to additional assembly line for installing air baffle. And the air baffle may be pre-installed on the heat sink, such that there is no need to additionally remove or install the air baffle during the removal or installation of the heat sink, thus simplifying the maintenance works of the electronic component and preventing forgetting the installation of the air baffle.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. An electronic assembly, comprising:
   a circuit board with a plurality of mount holes;
   an electronic component disposed on the circuit board; and
   a heat dissipating assembly comprising:
     a heat sink stacked on the electronic component and comprising a plurality of first installation hole portions respectively corresponding to the plurality of mount holes of the circuit board; and
     an air baffle disposed on the heat sink and comprising a second installation hole portion;
   wherein the second installation hole portion selectively corresponds to one of the plurality of first installation hole portions and one of the plurality of mount holes.

2. The electronic assembly according to claim 1, wherein the heat sink comprises a base portion, a heatsink portion, and a plurality of installation channels, the base portion is stacked on the electronic component, the heatsink portion comprises a plurality fins which extend outwardly from a surface of the base portion located opposite to the circuit board, the plurality of first installation hole portions are located on the base portion and respectively correspond to the plurality of installation channels, the second installation hole portion is selectively located in one of the plurality of installation channels.

3. The electronic assembly according to claim 2, wherein the air baffle comprises a main portion, a first extension portion, and a second extension portion, the main portion is disposed on the heatsink portion, the first extension portion is connected between the main portion and the second extension portion, the first extension portion and the second extension portion are respectively located at two adjacent sides of one of the installation channel, the second extension portion is stacked on the base portion and comprises the second installation hole portion.

4. The electronic assembly according to claim 3, wherein the first extension portion extends toward the base portion from the main portion along a direction parallel to the plurality of fins and are located between side edges of two of the plurality of fins.

5. The electronic assembly according to claim 3, further comprising a plurality of fasteners, wherein one of the plurality of fasteners penetrates through one of the plurality of first installation hole portions and the second installation hole portion via one of the plurality of installation channels and is inserted into one of the plurality of mount holes to fix the air baffle to the heat sink.

6. The electronic assembly according to claim 5, further comprising a plurality of elastic components respectively sleeved on the plurality of fasteners, wherein one of the plurality of elastic components is clamped by the second extension portion and one of the plurality of fasteners.

7. The electronic assembly according to claim 5, further comprising a cushioning structure located in the second installation hole portion and sleeved on one of the plurality of fasteners.

8. The electronic assembly according to claim 2, wherein one of the plurality of fins includes a first engagement portion on a sidewall thereof, the air baffle includes a second engagement portion engageable with the first engagement portion.

9. An electronic device comprising:
a device casing; and
an electronic assembly comprising:
    a circuit board disposed on the device casing and comprising a plurality of mount holes;
    an electronic component disposed on the circuit board; and
    a heat dissipating assembly comprising:
        a heat sink stacked on the electronic component and comprising a plurality of first installation hole portions respectively corresponding to the plurality of mount holes of the circuit board; and
        an air baffle disposed on the heat sink and comprising a second installation hole portion;
    wherein the second installation hole portion selectively corresponds to one of the plurality of first installation hole portions and one of the plurality of mount holes.

10. The electronic device according to claim 9, wherein the heat sink comprises a base portion, a heatsink portion, and a plurality of installation channels, the base portion is stacked on the electronic component, the heatsink portion comprises a plurality fins extend outwardly from a surface of the base portion located opposite to the circuit board, the plurality of first installation hole portions are located on the base portion and respectively correspond to the plurality of installation channels, the second installation hole portion is selectively located in one of the plurality of installation channels.

11. The electronic device according to claim 10, wherein the air baffle comprises a main portion, a first extension portion, and a second extension portion, the main portion is disposed on the heatsink portion, the first extension portion is connected between the main portion and the second extension portion, the first extension portion and the second extension portion are respectively located at two adjacent sides of one of the installation channel, the second extension portion is stacked on the base portion and comprises the second installation hole portion.

12. The electronic device according to claim 11, wherein the first extension portion extends toward the base portion from the main portion along a direction parallel to the plurality of fins and are located between side edges of two of the plurality of fins.

13. The electronic device according to claim 11, wherein the heat dissipating assembly further comprises a plurality of fasteners, one of the plurality of fasteners penetrates through one of the plurality of first installation hole portions and the second installation hole portion via one of the plurality of installation channels and is inserted into one of the plurality of mount holes to fix the air baffle to the heat sink.

14. The electronic device according to claim 13, wherein the heat dissipating assembly further comprises a plurality of elastic components respectively sleeved on the plurality of fasteners, and one of the plurality of elastic components is clamped by the second extension portion and one of the plurality of fasteners.

15. The electronic device according to claim 13, wherein the heat dissipating assembly further comprises a cushioning structure located in the second installation hole portion and sleeved on one of the plurality of fasteners.

16. The electronic device according to claim 10, wherein one of the plurality of fins includes a first engagement portion on a sidewall thereof, the air baffle includes a second engagement portion engageable with the first engagement portion.

17. A heat dissipating assembly, adapted for an electronic component, comprising:
    a heat sink comprising a base portion, a heatsink portion, a plurality of installation channels, and a plurality of first installation hole portions, wherein the base portion is stackable on the electronic component, the heatsink portion comprises a plurality of fins extend outwardly from the base portion, the plurality of first installation hole portions are located on the base portion and respectively correspond to the plurality of installation channels; and
    an air baffle disposed on the heatsink portion and comprising a second installation hole portion;
    wherein the second installation hole portion selectively corresponds to one of the plurality of installation channels and one of the plurality of first installation hole portions.

18. The heat dissipating assembly according to claim 17, wherein the air baffle comprises a main portion, a first extension portion, and a second extension portion, the main portion is disposed on the heatsink portion, the first extension portion is connected between the main portion and the second extension portion, the first extension portion and the second extension portion are respectively located at two adjacent sides of one of the plurality of installation channels, the second extension portion is stacked on the base portion and comprises the second installation hole portion.

19. The heat dissipating assembly according to claim 18, wherein the first extension portion extends toward the base portion from the main portion along a direction parallel to the plurality of fins and are located between side edges of two of the plurality of fins.

20. The heat dissipating assembly according to claim 18, further comprising a plurality of fasteners, wherein one of the plurality of fasteners penetrates through one of the plurality of first installation hole portions and the second installation hole portion via one of the plurality of installation channels.

* * * * *